(12) United States Patent
Campbell et al.

(10) Patent No.: US 6,222,378 B1
(45) Date of Patent: Apr. 24, 2001

(54) PROBE ADAPTER FOR A BALL-GRID-ARRAY PACKAGE

(75) Inventors: Julie A. Campbell, Beaverton; Raymond A. Zandonatti, Stayton, both of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/322,506

(22) Filed: May 28, 1999

(51) Int. Cl.[7] ................................................. G01R 1/067
(52) U.S. Cl. ................................. 324/754; 324/72.5
(58) Field of Search ................... 324/754, 72.5, 324/761

(56) References Cited

U.S. PATENT DOCUMENTS

| | | | | |
|---|---|---|---|---|
| 2,413,484 | * | 12/1946 | Berger | 324/72.5 |
| 2,516,657 | * | 7/1950 | Spendlove | 324/72.5 |
| 2,654,075 | * | 9/1953 | Gaborc | 324/72.5 |
| 2,675,528 | * | 4/1954 | La Point | 324/72.5 |
| 2,677,117 | * | 4/1954 | Swain | 324/72.5 |
| 2,702,892 | * | 2/1955 | Younger | 324/72.5 |
| 2,714,196 | * | 7/1955 | Melehan | 324/72.5 |
| 2,969,519 | * | 1/1961 | Thomas | 324/72.5 |
| 3,201,746 | * | 8/1965 | Askew | 324/72.5 |
| 3,315,163 | * | 4/1967 | Lutz | 324/72.5 |
| 5,548,223 | | 8/1996 | Cole et al. | |
| 5,717,328 | * | 2/1998 | Kerr et al. | 324/754 |
| 6,040,701 | * | 3/2000 | Swafford et al. | 324/754 |

* cited by examiner

Primary Examiner—Ernest Karlsen
(74) Attorney, Agent, or Firm—William K. Bucher

(57) ABSTRACT

A probing adapter for Ball-Grid-Array packages has an elongate body with a centrally disposed slotted region formed therein containing a slider that is movable within the slotted region. An electrically conductive plunger is attached to the slider and electrically coupled to an electrical contact exposed outside of the probe body. An electrode extends from the plunger and through an aperture formed in one end of the probe body to expose a hooked-shaped contact for making electrical contact with a solder ball contact of the ball grid assay package.

12 Claims, 3 Drawing Sheets

PROBE ADAPTER FOR A BALL-GRID-ARRAY PACKAGE

BACKGROUND OF THE INVENTION

The present invention relates generally to electrical probing of integrated circuit packages and more specifically to a probe adapter for acquiring signals from solder ball connections of a Ball-Grid-Array package.

Surface mounted (SMT) integrated circuit devices have become the dominant type of IC packaging in the electronics industry. These device come in a wide variety of package configurations and lead pitch geometries. For example, IC packages may be square or rectangular with electrical contact or lead counts from 44 to 232 or higher. A variety of electrical contact or lead types are also being used. Quad flat pack IC's use Gull wing leads or J-leads. Both type of leads extend from the perimeter of the IC package with the former type of leads bending down and outward from the package while the later bend down and fold under the package in a J-shape. The leads are soldered to electrical contact pads formed on a circuit board. Pin-Grid-Array (PGA) and Ball-Grid-Array (BGA) devices have electrical contacts formed in a matrix on the bottom surface of the IC package. The PGA devices have lead wires extending downward that engage a corresponding matrix of through holes in the circuit board. The leads are soldered in the through holes to make the electrical connections. BGA devices have a matrix of electrical contacts formed on the bottom surface of the IC with solder balls formed on each contact, which allow soldering of the contacts to a corresponding matrix of electrical contact pads on the circuit board.

Probing PGA devices with standard measurement instrument electrical probes, such as passive and active oscilloscope probes or the like, requires access to the reverse side of the circuit board on which the PGA device is soldered. For BGA devices, additional contact pads have to be formed on the circuit board and electrically connected to the matrix of contact pads underneath the BGA device to allow probing of the device.

Another solution for probing electrical contacts of a BGA device is a probe adapter as described in U.S. Pat. No. 5,548,223 and assigned to Tektronix, Inc., assignee of instant invention. The probe adapter is made of a flexible dielectric material having electrical contacts formed in a central region that correspond to the electrical contacts on the BGA device. Extending outward from the central region of the adapter are wings on which are formed conductive runs that extend from each of the electrical contacts in the central region to electrical contacts formed at the periphery of the wings. The central region of the adapter is positioned between the BGA device and the substrate or circuit board and soldered in place using the solder balls of the BGA device. Such an adapter is intended for use in troubleshooting and debugging prototype circuit designs but not intended for troubleshooting circuits in production circuit boards or failed circuits boards in products.

What is needed is a probe adapter that allows electrical probing of individual solder ball connections of a mounted Ball-Grid-Array device.

SUMMARY OF THE INVENTION

Accordingly, the present invention is directed to a probing adapter for a Ball-Grid-Array package. The probing adapter has an elongate body with a centrally disposed slotted region formed therein with an aperture formed in one end of the body that extends to the slotted region. The slotted region contains a slider that is movable from a first position to a second position. The slider has an electrically conductive plunger attached to it. An electrical contact is electrically coupled to the plunger with a portion of the electrical contact exposed outside of the elongate body. An electrode extends from the plunger and through the aperture in the elongate body to expose the electrode outside of the body for making electrical contact with a solder ball contact of the Ball-Grid-Array package. The adapter may include a flexible member attached to the one end of the elongate body with an aperture formed in it through which the electrode extends. The slider has detents formed in it for engaging corresponding detents formed in the slot. A spring-loaded push-button is mounted on the slider that engage and disengage the slider detents from the slot detents. A scale pointing element can be affixed to the slider that points to an adjacent scale positioned on the elongate body. Preferably the scale is disposed in the slot adjacent to the slider. In the preferred embodiment of the invention, the scale is adjustable using a scale adjustment member that is disposed in a second aperture formed in the elongate body that is opposite from the first aperture. A substantial portion of the electrode is covered with an insulating material with the ends of the electrode being exposed for making electrical connections with the plunger and the solder balls of the Ball-Grid-Array package. The exposed end of the electrode may be hooked-shaped for engaging the solder balls of the Ball-Grid-Array device.

The objects, advantages and novel features of the present invention are apparent from the following detailed description when read in conjunction with the appended claims and attached drawings.

BRIEF DESCRIPTION OF THE DRAWINGS

The present invention is illustrated by way of example in the figures of the accompanying drawings, in which like references indicate similar elements and in which.

DETAILED DESCRIPTION OF THE PREFERRED EMBODIMENT

Figure 1:
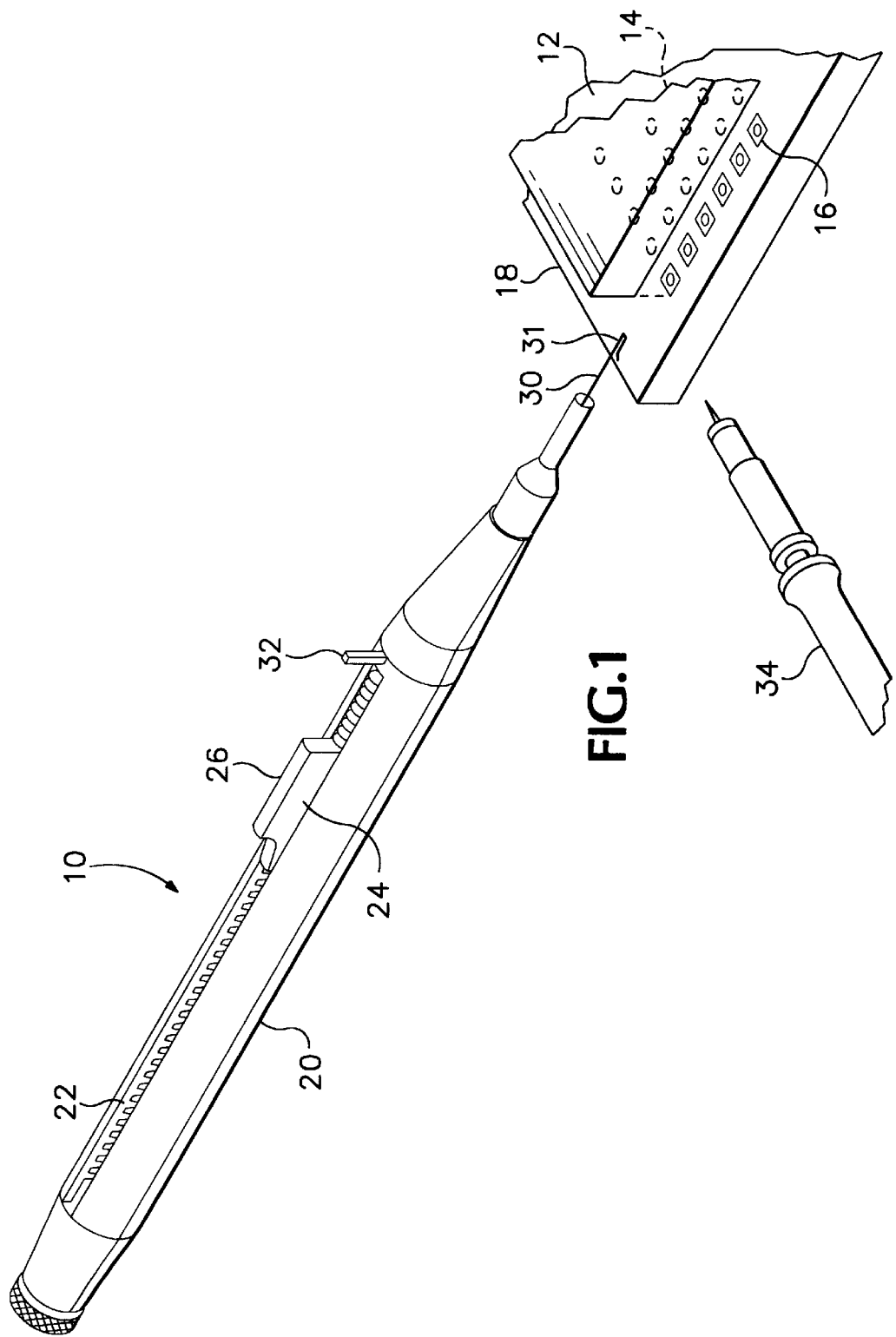
FIG. 1 is a perspective view of the probing adapter for a Ball-Grid-Array package according to the present invention.

Referring to FIG. 1, there is shown a probing adapter 10 for probing a Ball-Grid-Array (BGA) device or package 12 according to the present invention. The BGA device 12 has electrical contacts formed in an array on the bottom surface of the device with each contact having a solder ball 14 formed thereon. The solder balls 14 are positioned on a corresponding array of conductive pads 16 formed on a substrate or circuit board 18. The substrate or circuit board 18 region containing the BGA device 12 is heated to cause the solder balls 14 to flow and make permanent electrical connections between the electrical contacts on the BGA device 12 and the substrate 18.

The probing adapter 10 has an elongate body 20 with a centrally disposed slotted region 22. A movable slider 24 with a pushbutton control 26 is disposed within the slotted region 22. Attached to the slider 24 is a plunger 28, shown more clearly in FIGS. 2 and 3, that is connected to a probing electrode 30. The probing electrode 30 has a hooked-shaped contact 31 for making electrical contact with the solder balls 14 of the BGA device 12. An electrical contact 32 extends from the elongate body 20 that provides an electrical connection between the electrode 30 and a measurement probe 34, such as a passive or active voltage probe or the like.

Figure 2:
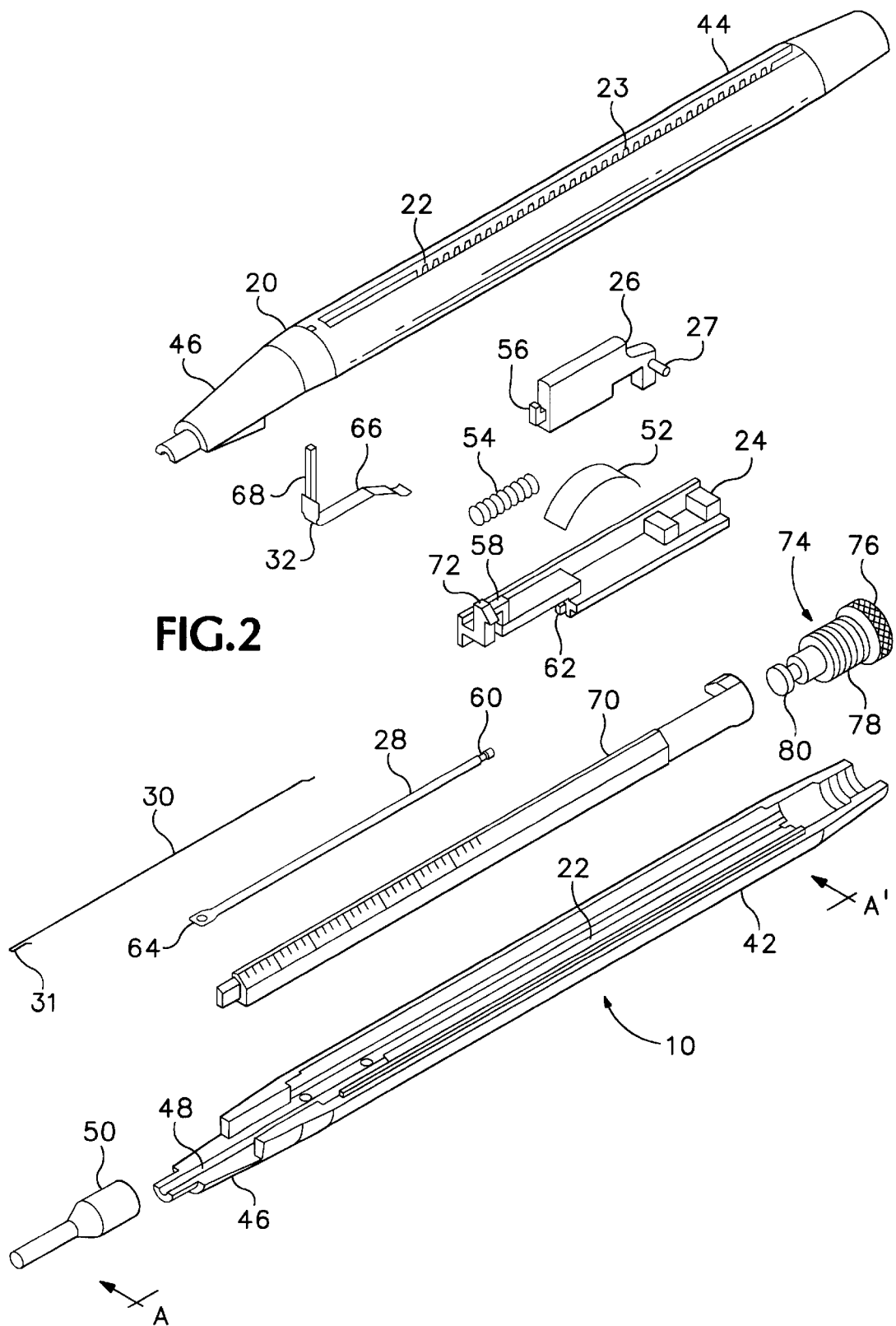
FIG. 2 is an exploded perspective view of the probing adapter for a Ball-Grid-Array package according to the present invention.
Figure 3:
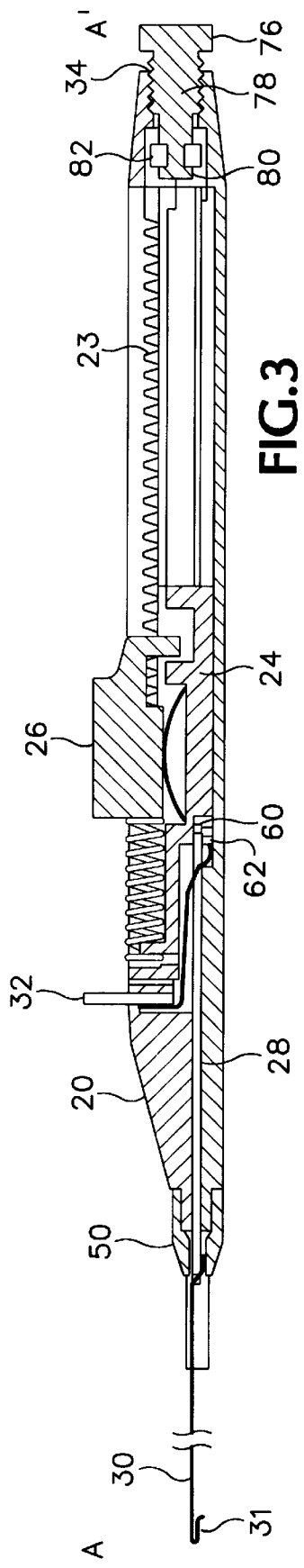
FIG. 3 is a side sectional view along line A–A' of the probing adapter for a Ball-Grid-Array package according to the present invention.

Referring to FIG. 2 and FIG. 3, there are shown an exploded perspective view of the probing adapter 10 for probing Ball-Grid-Array (BGA) packages according to the present invention and a side-sectional view of the probing adapter 10 along sectional line A–A'. Like elements in FIGS. 2 and 3 are labeled the same as in FIG. 1. The adapter 10 is formed of two halves 42 and 44 that are jointed together to produce the elongate body 20. Alternately, the elongate body 20 may be a single element that may be milled or produced as an injected molded part. Preferably, the elongate body is make of an electrically insulating material, such as polycarbonate or plastic. Centrally disposed within the elongate body 20 is the slotted region 22. A tapered nose region 46 extends from the slotted region 22 and has an aperture 48 therein for receiving the electrode 30 and associated plunger 28. A flexible nose section 50 may be added to the nose region 46.

The slotted region 22 receives a slider 24 that moves within the region 22. Downward directed rachet teeth 23 are formed on one or both sides of the slotted region 22. The slider 24 has a pushbutton 26 that is spring-loaded by the positioning of a spring element 52 between the slider 24 and the pushbutton 26. The pushbutton 26 includes a laterally disposed pin 27 or shoulders that extend from the side of the pushbutton 26 for engaging the rachet teeth 23 in the slotted region 22. A second spring element 54 is attached to lugs 56 and 58 respectively formed on the slider 24 and the pushbutton 26. The plunger 28 attaches to the slider 24 and moves within the slotted region 22. The attachment may be accomplished by forming a rib or groove 60 on one end of the plunger 28 that mates with a corresponding groove or rib 62 formed in the slider 24, as shown in FIG. 3. Additionally or alternately, an adhesive, such as an epoxy glue or the like may be used to attach the plunger 28 to the slider 24. The other end of the plunger 28 is formed with a hole or notch 64 for securing the electrode 30 to the plunger 28. In the preferred embodiment of the invention, the electrode 30 and the plunger 28 are made of an electrically conductive material. The electrode 30 is covered by an insulating material with the exception of the end that connects to the plunger 28. The insulating material prevents the electrode 30 from shorting the solder balls together. The other end of the electrode 30 is bent back on itself to form the hook-shaped contact 31. The end face of the electrode 30 is free of the insulating material to provide the electrical contact. The insulation free end face may be produced by cutting the end of the electrode with wire cutters. The angle of the cut may be beveled to produce a bard-like end on the contact 31. The electrical contact 32 has first and second contacts 66 and 68 and is secured in the elongate body 20 with the first contact 66 electrically coupled to the plunger 28 and the second contact 68 exposed outside the elongate body 20.

In the preferred embodiment of the invention, a movable scale 70 is mounted in or disposed adjacent to the slotted region 22 next to the slider 24. The slider 24 is provided with a scale pointing element 72. The opposite end of the elongate body 16 from the nose end has a threaded aperture 34 formed therein that receives a scale adjustment member 74. The scale adjustment member 74 has a knurled knob 76 and a threaded central portion 78 that engages corresponding threads in the aperture 34. The end opposite the knurled knob 76 has a circular flange element 80 that engages a slot 82 formed in the end scale 70 that allows movement of the scale 70 with the turning of the scale adjustment member 74.

The probe adapter 10 is used by first placing the nose 50 of the adapter 10 against the edge of the Ball-Grid-Array package 12. Moving the slider 24 toward the nose 50 of the adapter 10 advances the hook-shaped end 31 of the wire electrode 30 out of the adapter 10. The hook-shaped end 31 is moved just past the first solder ball 14 at the entry to the tunnel formed by two rows of solder balls 14. Preferably the plunger 28 is free to rotate relative to the slider 24 to allow the hooked-end 31 of the electrode 30 to be positioned toward either the right or left solder balls in any particular solder ball tunnel. The slider 24 is then retracted and latched toward the back end of the adapter 10 by the spring force of spring 54. This causes the hook-tip 31 to bite or snag the solder ball 14 that it has just passed. The action causes a good electrical connection to be made between the electrode 30 and the first solder ball 14. The knurled knob 76 at the end of the adapter 10 is turned until the value of "1" on the adjustable visual scale 70 is aligned with the scale pointing element 72 on the slider 24 indicating that the hook end 31 of the electrode 30 is on solder ball "1". This adjustment serves to eliminate concerns of dimensional tolerance difference between Ball-Grid-Array package 12 vendors since dimensions from package edge to the first ball can vary from one vendor to the next.

The electrical signal on the solder ball 14 is coupled from the electrode 30 to the plunger 28. The plunger 28 is in wiping electrical contact with to the electrical contact 32. A measurement probe, such as a passive or active voltage probe, is placed on the electrical contact 32 that is exposed outside the elongate body 20 to couple the electrical signal to a measurement test instrument, such as an oscilloscope, logic analyzer, or the like. If a user decides to probe another solder ball 14 in the row, the pushbutton 26 can be pressed down and the slider 24 can be advanced along the slotted region 22 until the visual pointer 72 on the slider 24 is just past the corresponding solder ball number on the movable scale 70. Depressing the pushbutton 26 and moving it toward the back end of the adapter 10 causes the slider 24 to again retract towards the back end of the adapter 10 thus causing the hook-tip 31 to bite into the solder ball 14 that it has just passed. The pushbutton 26 can be released and allowed to seat itself in the nearest detent, The spring 54 between the pushbutton 26 and the slider 24 causes a force to be exerted on the wire hook 31.

When the user is done probing the solder balls 14 along any particular row, the slider 24 is advanced fully to the front end of the slotted region 22. This causes the hook-shaped end 31 of the electrode 30 to protrude out of the opposite end of the Ball-Grid-Array package 12 from where it started. The slider 24 has enough movement within the slotted region 22 to expose the mechanical joint between the plunger 28 and the electrode 30. The wire electrode 30 may is detached from the plunger 28, and the wire electrode removed from under the Ball-Grid-Array package 12 by seizing the hook-shaped end and removing the wire electrode 30 from underneath the Ball-Grid-Array package.

A probing adapter 10 for Ball-Grid-Array packages has been described having an elongate body 20 with a centrally disposed slotted region 22 formed therein containing a slider 24 that is movable within the slotted region. An electrically conductive plunger 28 is attached to the slider 24 and electrically coupled to an electrical contact 32 that is exposed outside of the probe body 20. An electrode 30 extends from the plunger 28 and through an aperture 48 formed in one end of the probe body 20 to expose a hooked-shaped contact 31 for making electrical contact with a solder ball 14 contact of the Ball-Grid-Array package. The slider 24 may include a scale pointing element 72 that works in conjunction with a movable scale 70 mounted adjacent to the slider 24 to indicate the location of each solder ball 14 contact under the Ball-Grid-Array 12 package.

It will be obvious to those having skill in the art that many changes may be made to the details of the above-described embodiments of this invention without departing from the underlying principles thereof The scope of the present invention should, therefore, be determined only by the following claims.

What is claimed is:

1. A probing adapter for a Ball-Grid-Array package comprising:
    an elongate body having a centrally disposed slotted region formed therein with one end of the body having an aperture formed therein that extends to the slotted region;
    a slider positioned in the slotted region and movable from a first position to a second position;
    an electrically conductive plunger having one end attached to the slider and having sufficient length to allow movement of the other end from inside the elongate body to outside the elongate body;
    an electrical contact electrically coupled to the plunger having a portion thereof exposed outside of the elongate body; and
    a removable electrode having one end mechanically and electrically connected to the plunger with the electrode extending through the aperture in the elongate body to expose the other end of the electrode outside of the body for making electrical contact with a solder ball contact of the Ball-Grid-Array package.

2. The probing adapter as recited in claim 1 further comprising a flexible member attached to the one end of the elongate body having the aperture with the flexible member having an aperture formed therein for receiving the electrode.

3. The probing adapter as recited in claim 1 further comprising a plurality of detents formed in the slot that engage corresponding detents on the slider.

4. The probing adapter as recited in claim 3 further comprising a spring-loaded push-button mounted on the slider that engage and disengage the slider detents from the slot detents.

5. The probing adapter as recited in claim 1 further comprising a scale disposed in the slot in the elongate body adjacent to the slider.

6. The probing adapter as recited on claim 5 further comprising a scale pointing element affixed to the slider adjacent to the scale.

7. The probing adapter as recited in claim 5 wherein the scale is adjustable from a first position to a second position and the adapter further comprising a second aperture formed in the elongate body at the opposite end of the body with the aperture having a scale adjustment member disposed in the aperture in contact with the adjustable scale.

8. The probing adapter as recited in claim 1 further comprising an insulating material surrounding a substantial portion of the electrode with the ends of the electrode being exposed for making electrical connections with the plunger and the solder balls of the Ball-Grid-Array package.

9. The probing adapter as recited in claim 8 wherein the electrode end contacting the solder balls has a hook-shaped contact.

10. A probing adapter for a Ball-Grid-Array package comprising:
    an elongate body having a centrally disposed slotted region formed therein with opposite ends of the body having respective first and second apertures formed therein that extends to the slotted region, the slotted region having a plurality of detents;
    a positionable scale disposed in the slot in the elongate body adjacent to the slider;
    a scale positioning member disposed in the first aperture and in contact with the adjustable scale;
    a slider positioned in the slotted region having detents formed thereon that engage the detents in the slotted region and a scale pointing element affixed to the slider adjacent to the scale, the slider movable from a first position to a second position;
    an electrically conductive plunger having one end attached to the slider and having sufficient length to allow movement of the other end from inside the elongate body to outside the elongate body;
    an electrical contact electrically coupled to the plunger having a portion thereof exposed outside of the elongate body; and
    a removable electrode having one end mechanically and electrically connected to the plunger with the electrode extending through the second aperture in the elongate body to expose the other end of the electrode outside of the body with the exposed end of the electrode having a hook-shaped contact for making electrical contact with a solder ball contact of the Ball-Grid-Array package and insulating material surrounding the electrode except for the ends.

11. The probing adapter as recited in claim 10 further comprising a flexible member attached to the one end of the elongate body having the aperture with the flexible member having an aperture formed therein for receiving the electrode.

12. The probing adapter as recited in claim 10 further comprising a spring-loaded push-button mounted on the slider that engage and disengage the slider detents from the slot detents.

* * * * *